(12) United States Patent
Chen et al.

(10) Patent No.: US 6,461,678 B1
(45) Date of Patent: Oct. 8, 2002

(54) PROCESS FOR METALLIZATION OF A SUBSTRATE BY CURING A CATALYST APPLIED THERETO

(75) Inventors: Ken S. Chen; William P. Morgan; John L. Zich, all of Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 489 days.

(21) Appl. No.: 08/845,814

(22) Filed: Apr. 29, 1997

(51) Int. Cl.[7] .............................. B05D 5/12; B05D 3/00; H05K 3/00
(52) U.S. Cl. .................... 427/304; 427/98; 427/306; 427/379; 427/437; 427/443.1; 205/126
(58) Field of Search .................... 427/98, 304, 379, 427/305, 306, 437, 443.1; 106/1.11, 1.05; 205/126

(56) References Cited

U.S. PATENT DOCUMENTS

| | | | |
|---|---|---|---|
| 5,153,023 A | 10/1992 | Orlowski et al. | 427/555 |
| 5,192,581 A | 3/1993 | Hirsch et al. | 427/556 |
| 5,316,867 A * | 5/1994 | Chao et al. | 427/306 |
| 5,348,574 A * | 9/1994 | Tokas et al. | 106/1.11 |

* cited by examiner

*Primary Examiner*—Brian K. Talbot
(74) *Attorney, Agent, or Firm*—V. Gerald Grafe

(57) ABSTRACT

An improved additive process for metallization of substrates is described whereby a catalyst solution is applied to a surface of a substrate. Metallic catalytic clusters can be formed in the catalyst solution on the substrate surface by heating the substrate. Electroless plating can then deposit metal onto the portion of the substrate surface coated with catalyst solution. Additional metallization thickness can be obtained by electrolytically plating the substrate surface after the electroless plating step.

7 Claims, 1 Drawing Sheet

PROCESS FOR METALLIZATION OF A SUBSTRATE BY CURING A CATALYST APPLIED THERETO

This invention was made with Government support under Contract DE-AC04-4AL85000 awarded by the U. S. Department of Energy. The Government has certain rights in the invention.

BACKGROUND OF THE INVENTION

This invention relates to the field of additive metallization of substrates.

Many electronic applications require patterned metallization of nonconductive substrates for interconnection among electronic devices. Examples of such applications include high density packaging (multi-chip modules), antennas, flex circuits, printed wiring boards, and flat panel displays. The metallic interconnects are conventionally formed by subtractive processes. Modern additive processes attempt to overcome the drawbacks of subtractive processes.

In a subtractive metallization process, a surface of the substrate is first fully coated. Alternatively, a metal sheet can be laminated onto a flat substrate using adhesive. Selected portions of the metal plating are then etched to leave the desired patterned metallization. Vacuum-assisted physical vapor deposition and sputtering deposition are often used to achieve en masse plating. Physical vapor and sputtering deposition require high vacuum, and consequentially high capital equipment and operating costs. Those deposition processes can also result in poor adhesion of the metal to the substrate.

Full coverage metal plating can also be achieved by sensitizing a surface of the substrate with a palladium chloride/tin chloride bath and chemically reducing palladium ions to form catalytic clusters. Electroless plating followed by electrolytic plating deposits metal on the surface. This process can be costly due to the large number of wet processing steps, and the chemical dissimilarity between the metal coating and the substrate discourages chemical bonding therebetween. Consequently, the metal only weakly adheres to the substrate.

After full coverage metal plating, a layer of resist (a photoresist is often used) is deposited in a pattern on top of the metal layer, with the pattern corresponding to the desired metallization pattern. A subsequent etching step removes all the metal except that protected by the patterned resist layer. The etching process is usually time consuming and costly, and can require the use of materials unfriendly to the environment.

Additive processes have been proposed to overcome the environmental drawbacks of subtractive processes. The additive processes proposed achieve only thin layers of metallization, limiting their practical applications. See, e.g., Tokas et al., U.S. Pat. No. 5,348,574. The proposed processes also suffer from poor adhesion, just as with the subtractive processes. Some of the additive processes retain resist and etching steps; consequently, they suffer from the same environmental hazards as the subtractive processes. See, e.g., Hirsch et al., U.S. Pat. No. 5,192,581. Others have process limitations that limit their uses with widely available substrate materials. See, e.g., Orlowski et al., U.S. Pat. No. 5,153,023. Metal/foil adhesive processes use costly thick metal foils and poorly adhering low molecular weight polymer adhesives.

Accordingly, there remains a need for improved additive metallization processes, specifically for processes that provide improved adhesion between the substrate and the metallization and that can provide the increased metallization thickness required in practical applications such as printed wiring boards.

SUMMARY OF THE INVENTION

The present invention provides an improved additive process for metallization of substrates. The improved process comprises applying a catalyst solution onto the substrate. The catalyst solution can coat an entire surface of the substrate or can be selectively applied to only a portion of a substrate surface. The concentration of solvent in the layer of catalyst solution on the substrate surface can be reduced by heating the coated substrate. Metallic clusters can be formed in the remaining catalyst layer by further heating the substrate. Electroless plating can then deposit metal onto the coated portion of the substrate. Additional metallization thickness can be obtained by electrolytically plating the substrate after the electroless plating step. The improved process requires only one wet processing step (applying the catalyst solution onto the substrate) and does not require a high vacuum, so capital and operational costs are less than with existing processes. The improved process also does not require an etching step, avoiding the environmental hazards of chemical etching. The improved process results in improved adhesion of the metallization to the substrate and increased metallization thickness, making it suitable for a wider range of applications than existing processes.

Advantages and novel features will become apparent to those skilled in the art upon examination of the following description or may be learned by practice of the invention. The objects and advantages of the invention may be realized and attained by means of the instrumentalities and combinations particularly pointed out in the appended claims.

DESCRIPTION OF THE FIGURES

The accompanying drawings, which are incorporated into and form part of the specification, illustrate embodiments of the invention and, together with the description, serve to explain the principles of the invention.

DETAILED DESCRIPTION OF THE INVENTION

The present invention provides a process for metallization of substrates.

Figure 1A:
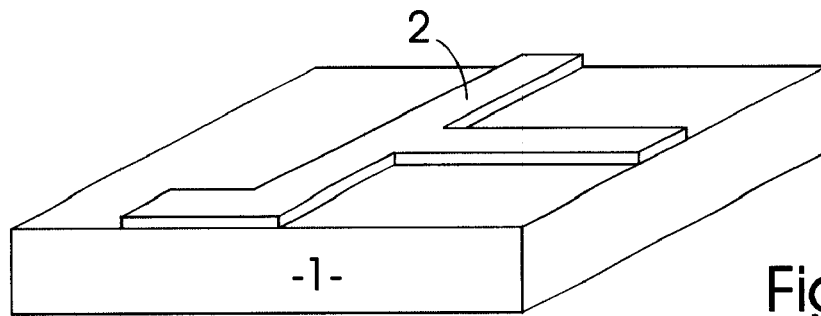
FIGS. 1(*a–d*) shows a substrate during processing according to the present invention.
Figure 1B:
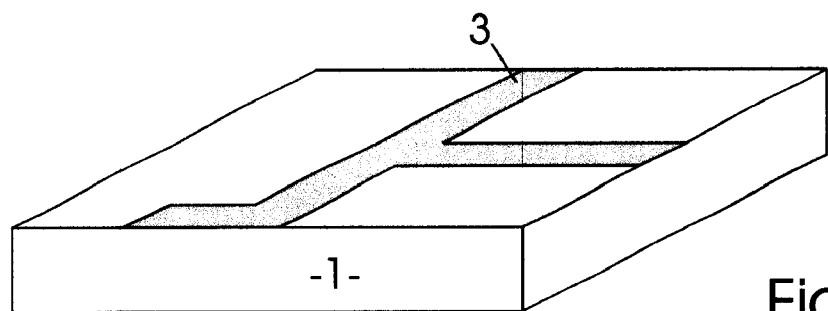
Figure 1C:
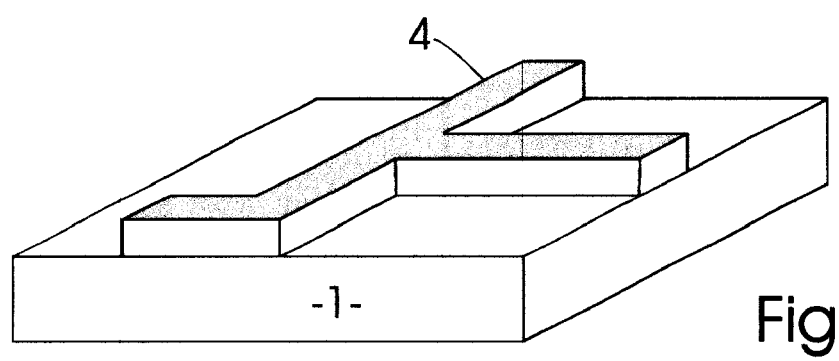
Figure 1D:
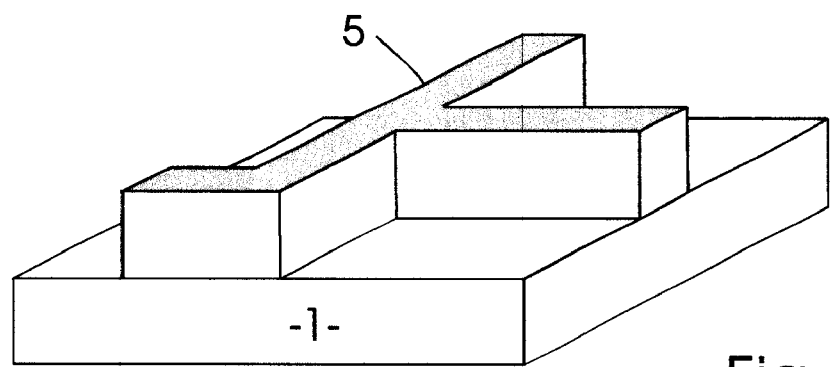

FIGS. 1(*a–d*) shows a substrate during processing according to the present invention. The process comprises applying a catalyst solution 2 to a surface of a substrate 1. The catalyst solution 2 comprises a solvent, a carrier, and metal catalyst ions. The catalyst solution 2 can cover an entire surface of the substrate 1 or can be selectively applied to only a portion of a surface of substrate 1. The concentration of solvent in the layer of catalyst solution 2 on the surface of substrate 1 can be reduced by heating the substrate 1. Metallic clusters 3 can be formed in the remaining catalyst layer by further heating the substrate 1. Electroless plating can then deposit metal 4 onto the portion of the surface of substrate 1 coated with the catalyst solution. Electrolytic plating can then deposit additional metal 5 onto the portion of the surface of substrate 1 coated with the catalyst solution.

Application performance objectives often constrain the choice of a substrate material. For example, the application might require that the substrate be a good electrical insulator.

The application might require that the substrate remain stable when subjected to very high or very low temperatures, or to certain temperature variations. The application might require a substrate capable of withstanding repeated stretching or bending cycles. The application might also require that the substrate have properties compatible with other components (e.g., thermal expansion). The present invention is suitable for use with commonly used organic polymeric substrate materials such as polyimide, polyester, polyurethane, and epoxy-based polymers. It is also suitable for use with other substrate materials such as microporous carbon foams.

The choice of substrate material affects the composition chosen for the catalyst solution. The catalyst solution comprises a suitable polymer carrier (including monomers and oligomers), catalyst ions, and a solvent or solvents. Palladium can be used as a catalyst because of its low cost. Gold, platinum, iridium, rhodium, and ruthenium can also be used as catalysts. Palladium ions can be obtained by dissolving a palladium salt (e.g., palladium chloride or palladium acetate) in the catalyst solution. Ammonium hydroxide can be used to complex the catalyst ions to prevent them from forming complexes with the polymer carrier. The catalyst solution can comprise additional components such as surfactants to improve wettability and hence uniformity of substrate coverage. The specific choices for carrier and solvent can depend on the substrate chemistry and surface features, as discussed below.

The polymer carrier can be chosen so that it achieves several basic objectives:

The polymer carrier should be dissolved by the solvent so that a solution results.

The polymer carrier should not complex with palladium ions on mixing with the palladium salt.

The polymer carrier should allow palladium ions to diffuse within a solid matrix of the polymer carrier during activation.

The polymer carrier should be identical to, similar to, or compatible with the substrate upon solidification so that good adhesion is created between the substrate and the solid matrix of the polymer carrier.

For organic polymer substrate material, numerous polymers, including monomers and oligomers, can be suitable carriers. A polyamic-acid carrier can be used with solvents such as 1-methyl-2-pyrrolidinone. For example, a solution of 34.6% by weight polyamic acid, 62.35% by weight 1-methyl-2-pyrrolidinone, 0.925% by weight palladium acetate, 2.1% by weight concentrated ammonia hydroxide, and 0.025% by weight FC 430 (a fluoroaliphatic polymeric ester surfactant from 3M Corporation) forms a suitable catalyst solution. A polyamic-acid carrier becomes polyimide once polymerized or cured, and therefore is especially suitable for use with polyimide substrate materials. Polyamic-acid carriers can require high curing temperatures (approximately 300 C. to 330° C.), and are therefore not suitable for use with substrates that cannot withstand such temperatures.

A polyvinyl butyral carrier can be used with a solvent such as a mixture of 4-methyl-2-pentanol and n-butanol. For example, a solution of 4.9% by weight polyvinyl butyral, 1.45% by weight palladium chloride, 30.0% by weight 4-methyl-2-pentanol, and the remainder n-butanol forms a suitable catalyst solution.

A polyvinyl chloride latex resin carrier can be used with water as a solvent. Aqueous solutions can be less environmentally hazardous than organic solvent-based solutions. For example, a solution of 18.2% by weight polyvinyl chloride latex resin, 3.3% by weight butyl cellosolve, 3.4% by weight palladium acetate, 7.5% by weight concentrated ammonium hydroxide, 5.4% by weight polyurethane resin (such as the ACRYSOL RM-8W thickening agent marketed by Rohm and Haas), 4.5% by weight Triton-X 100 (a polyethylene glycol-based surfactant marketed by Aldrich), and the remainder water forms a suitable catalyst formulation. Both the polyvinyl butyral carrier and the polyvinyl chloride latex carrier can be cured at low temperatures (approximately 150° C. to 190° C.). Accordingly, they are suitable for use with substrates such as polyester and epoxy-based polymers that cannot withstand the high temperatures needed for curing a polyamic-acid carrier.

The catalyst solution is applied to a surface of the substrate. Dipping, spraying, slide coating, slot coating, roll coating, Meyer-rod coating, gravure coating, and drawdown processes known to those skilled in the art can coat an entire surface of the substrate. Full coating can result in full metallization of the substrate surface. Etching processes known to those skilled in the art can be used to remove selected portions of the full coating if a patterned metallization is required. Alternatively, processes such as screen printing, flexographic printing, plotting, ink-jet printing, and gravure printing can apply catalyst solution to only selected portions of the substrate surface. The substrate surface will be metallized only where the catalyst solution was applied. Accordingly, a patterned application of catalyst solution can result in patterned substrate metallization without costly and hazardous etching processes.

Processing such as heating the substrate can reduce the concentration of solvent in the catalyst solution on the substrate surface. Solvent removal can dry the catalyst coating and allow easier handling and storage. A properly dried catalyst layer on a substrate can be stored for many years before activation. For example, a polyamic-acid catalyst solution on a polyimide substrate can be dried by heating it for 15 minutes to 60 minutes at temperatures of 50° C. to 100° C. For ease of handling, the majority of the solvent should be removed. Excessive drying temperatures should be avoided because they can trap solvent beneath thick polymer carrier surface skins. Generally, heating to at least one third the boiling temperature of the solvent until at least half the solvent is removed is desirable; heating until 90% of the solvent is removed is preferred.

Thermal energy supplied to the substrate and catalyst coating activates the palladium catalyst. Thermal activation accomplishes several important tasks:

It produces catalytic metallic palladium clusters by reducing the palladium ion to palladium metal and by diffusion of palladium metal to form clusters by nucleation and growth.

It polymerizes or otherwise cures the polymer carrier in the catalyst coating to foster cohesive strength within the cured carrier.

It fosters interdiffusion of molecules between the substrate and the polymer carrier, causing enhanced adhesion between the substrate and the cured polymer carrier.

In general, long exposure to temperatures sufficient to soften the substrate (i.e., above the glass transition temperature of the substrate) and cure the polymer carrier is desirable. The activation must not melt the substrate, but long exposure to sufficient temperatures promotes adhesion between the substrate and the polymer carrier. Long exposure to sufficient temperatures also promotes complete cure of the polymer carrier, fostering adhesion of the palladium or other catalyst and resulting metallization to the polymer carrier. For a polyamic-acid catalyst solution on a polyimide substrate material, the catalyst-coated substrate can be subjected to activation temperatures of approximately 300° C. to 330° C. (320° C. preferred) for at least 15 minutes. Longer times, 120 minutes or more, are preferred. For polyvinyl butyral and PVC latex catalyst solutions, the catalyst coated substrate can be subjected to temperatures of approximately 150° C. to 190° C. for at least 15 minutes.

After thermal activation, any one of a plurality of electroless plating processes can deposit metal on the substrate. Electroless plating processes are known to those skilled in the art. See, e.g., Electroless Plating: Fundamentals and Applications, edited by G. O. Mallory and J. B. Hajdu, 1990. Commercial copper plating baths, for example Shipley Cuposit 328, are suitable for use with the present invention (Shipley Cuposit 328 bath conditions: 3 g/L suspended copper, 7.5 g/L formaldehyde, 23° C. operating temperature, 10.2 bath pH). Other metals such as gold, silver, and nickel can also be deposited. In electroless plating, reducing agents such as formaldehyde are oxidized to produce electrons. Metal ions in the plating bath consume the electrons and are reduced to metal. The reduction chemical reaction proceeds in the presence of a catalyst such as palladium metal or palladium metal clusters. Palladium metal clusters greater than 5 nm in size are effective as catalysts in electroless plating processes.

Heating the substrate after electroless plating can significantly increase adhesion of the metallization to the substrate. The mechanisms involved are not yet well understood, but additional heating can remove moisture at the polymer-metal interface that reduces bonding strength. Additional heating can also cause oxidation of metal at the polymer-metal interface, which can increase bonding strength and thereby improve adhesion. Additional heating can also help further cure the polymer carrier. For example, heating for at least one hour at 80° C. to 200° C. (two hours at 170° C. preferred) is suitable.

Existing electroless plating processes can normally deposit metal up to a few microns thick in a reasonable time. A new commercial copper bath, Circuposit 71 Full Build Electroless Copper, marketed by Shipley, can deposit 25 microns of copper in ten hours. It has also been reported that 25 micron thick copper can be deposited using commercial baths in eight to fourteen hours. See, e.g., "Electroless Plating: Fundamentals and Applications," Chapter 13, edited by Mallory and Hajdu, 1990.

Alternatively, electrolytic plating can be used to deposit additional metal to the desired thickness on the seed metal layer formed by electroless plating. Electrolytic plating is more efficient (has a higher plating rate) than electroless plating. Electrolytic plating processes comprise applying an electric current through a copper anode to provide electrons needed in the reduction chemical reaction at the cathode and are known to those skilled in the art. See, e.g., Electroplating (a chapter in Comprehensive Treatise of Electrochemistry Vol. 2, Bockris, Conway, Yeager, and White, Plenum Press, NY 1981); Fundamentals of Metal Deposition (Raub and Muller, Elsevier, Amsterdam, 1967). Commercial electrolytic plating solutions, for example the LeaRonal Glean Copper PC Plating Bath, can be used to increase the metal thickness from the seed metal layer deposited by electroless plating (LeaRonal Glean Copper PC Plating Bath composition: 12 oz./gal. copper sulfate, 25 oz./gal. sulfuric acid, 70 ppm chloride, 0.5% Copper Glean PC additive; process conditions: air agitation, 30 amps/square foot cathode current density, phosphorized copper anode).

The following non-limiting examples further illustrate the invention.

EXAMPLE 1

Polyamic-acid catalyst ink was plotted on a 5 mil thick Kapton sheet substrate using a 7475A Hewlett-Packard plotter to produce a pattern comprising ten 0.125 inch by 9 inch strips covered with catalyst solution and nine 0.0625 inch by 9 inch spacing strips (i.e., without catalyst coverage). One end of the strips were open (i.e., they were not connected to anything) but the other ends were connected to a 1 inch by 4 inch strip that was covered with catalyst solution. After plotting, the sample was immediately transferred to a low-temperature oven and dried at 80° C. for 30 minutes. It took about 15 minutes to complete the plotting, during which time the plotted strips were air dried. After drying, the sample was further heated in a high-temperature oven at 320° C. for four hours. The sample was then air-cooled at room temperature until the entire sample reached room temperature. Next, the sample was placed vertically into a Shipley Cuposit 328 electroless copper bath and plated at room temperature (23° C.) for 60 minutes. The electrolessly plated sample was heated in an oven at 150° C. for 2 hours. After cooling the sample to room temperature, it was electrolytically plated in a LeaRonal Gleam Copper PC Plating bath at room temperature for three hours at an applied current density of 5.5 amps/square foot. Peel strength test using the IPC-TM-650 technique was performed on the sample one week after electrolytic plating (the sample was left on the bench during the week). It was found that the catalyzed strips were uniformly plated (with an average copper thickness of 1.13 mil or about 28 microns) and that the adhesion between the copper coating and the Kapton substrate was substantially uniform with an average peel strength of 9.2 lbs/inch.

EXAMPLE 2

A 1 inch by 3 inch by 0.25 inch microporous open-cell vitreous carbon foam with an average pore size of 80 ppi (ppi refers to pores per inch) was immersed in the polyvinyl chloride latex resin catalyst solution for 1 minute. Excess catalyst solution was blown out of the pores with compressed nitrogen. The sample was then dried in an oven at 60° C. for 30 minutes. After drying, the sample was further heated in an oven at 180° C. for 60 minutes. After air cooling, the sample was then plated in a Shipley Cuposit 328 electroless copper bath for 60 minutes. The plated microporous carbon sample was found to be uniformly plated with good adhesion. The above process was repeated on a 1 inch by 3 inch by 0.25 inch microporous polyurethane foam with a similar average pore size and the foam was uniformly plated with good adhesion.

EXAMPLE 3

A 9.25 inch by 4 inch radar reflector's concave parabolic surface was brush coated with a layer of polyvinyl butyral catalyst solution. The radar-reflector was made of epoxy polymer and was fabricated using a stereolithography technique. The coated sample was dried in an oven at 60° C. for 30 minutes. After drying, the sample was further heated in an oven at 180° C. for 60 minutes. After air cooling, the sample was then plated in a Shipley Cuposit 328 electroless copper bath for 15 minutes. The part was then electrolytically plated in a LeaRonal Gleam Copper PC Plating bath at room temperature for one hour at an applied current density of 20 amps/square foot. The plating on the radar-reflector surface was substantially uniform with good adhesion.

EXAMPLE 4

A toroid (3 inch outside diameter, 1 inch inside diameter, and the diameter of the circle from which the toroid was formed by rotating it is 1 inch) made of epoxy polymer using stereolithography was brush coated with a layer of polyvinyl butyral catalyst solution. The coated sample was dried in an oven at 60° C. for 30 minutes. After drying, the sample was further heated in an oven at 180° C. for 60 minutes. After air cooling, the sample was then plated in a Shipley Cuposit 328 electroless copper bath for 15 minutes. The part was then electrolytically plated in a LeaRonal Gleam Copper PC Plating bath at room temperature for one hour at an applied current density of 20 amps/square foot. The plating on the toroid surface was substantially uniform with good adhesion.

The particular sizes and equipment discussed above are cited merely to illustrate particular embodiments of the invention. It is contemplated that the use of the invention may involve components having different sizes and characteristics. It is intended that the scope of the invention be defined by the claims appended hereto.

We claim:

1. A process for metallization of a nonconductive substrate, comprising:
   a) coating a portion of a surface of the substrate with a catalyst solution selected from the group consisting of:
      i) a polyvinyl butyral carrier, palladium ions, and a solvent chosen from the group consisting of: 4-methyl-2-pentanol, n-butanol, and combinations thereof; and
      ii) a polyvinyl chloride latex carrier, a water solvent, and palladium ions;
   b) reducing the concentration of the solvent in the catalyst solution on the substrate surface by heating the substrate at temperatures of at least 50° C. for at least 15 minutes;
   c) reducing the palladium ions to form palladium clusters by heating the substrate for at least 15 minutes at temperatures of at least 150° C.; and
   d) electroless plating metal onto the portion of a surface of the substrate.

2. The process of claim 1, further comprising heating the substrate after electroless plating for at least 1 hour at temperatures of at least 80° C.

3. The process of claim 1, further comprising electrolytic plating after electroless plating.

4. A process for metallization of a substance, comprising:
   a) coating a portion of a surface of the substrate with a catalyst solution comprising a carrier selected from the group consisting of polyvinyl chloride, polyvinyl butyral, and combinations thereof, a solvent, and catalyst ions, wherein the substrate is made of a material selected from the group consisting of polyester, polyurethane, epoxy-based polymer, microporous carbon foam, and combinations thereof;
   b) decreasing the concentration of the solvent in the catalyst solution on the substrate surface;
   c) reducing the catalyst ions to form catalyst clusters and curing the carrier;
   d) reducing metal ions in the presence of the catalyst clusters and depositing metal onto the substrate; and
   e) heating the substrate after depositing metal onto the substrate.

5. A process for metallization of a polymeric substrate, comprising:
   a) coating a portion of a surface of the substrate with a catalyst solution comprising a polyamic acid carrier, a 1-methyl-2-pyrrolidinone solvent, and palladium ions;
   b) decreasing the concentration of the solvent in the catalyst solution on the substrate surface by heating the substrate at temperatures of at least 50° C. for at least 15 minutes,
   c) reducing the palladium ions to form palladium clusters by heating the substrate for more than 40 minutes at temperatures of at least 300° C;
   d) electroless plating metal onto the portion of a surface of the substrate and
   e) heating the substrate after electroless plating for at least 1 hour at temperatures of at least 140° C.

6. A process for metallization of a polyimide substrate, comprising:
   a) coating a portion of a surface of the substrate with a catalyst solution comprising a carrier, a solvent, and catalyst ions;
   b) decreasing the concentration of the solvent in the catalyst solution on the substrate surface;
   c) reducing the catalyst ions to form catalyst clusters and curing the carrier;
   d) reducing metal ions in the presence of the catalyst clusters and depositing metal onto the substrate; and
   e) heating the substrate for at least 1 hour at temperatures over 150° C. after depositing metal onto the surface.

7. The process of claim 6, wherein the step of heating the substrate comprises heating the substrate for at least 2 hours at temperatures over 170° C.

* * * * *